(12) United States Patent
Hu et al.

(10) Patent No.: US 7,501,149 B2
(45) Date of Patent: Mar. 10, 2009

(54) ELECTRODE AND METHOD FOR FORMING THE SAME

(75) Inventors: Ying-Chiang Hu, Bade (TW); Yii-Tay Chiou, Kaohsiung (TW); Chun-Hsun Chu, Tainan (TW); Bor-Chen Tsai, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/324,630

(22) Filed: Jan. 4, 2006

(65) Prior Publication Data

US 2007/0080462 A1   Apr. 12, 2007

(30) Foreign Application Priority Data

Oct. 6, 2005   (TW) .............................. 94134909 A

(51) Int. Cl.
B05D 5/12 (2006.01)
B05D 3/00 (2006.01)

(52) U.S. Cl. .................. 427/191; 427/217; 427/229; 427/376.6; 427/376.7; 228/122.1; 228/248.1

(58) Field of Classification Search ............. 427/96.1, 427/205, 226, 229, 191, 217, 376.6, 376.7; 438/610, 679; 228/122.1, 248.1
See application file for complete search history.

(56) References Cited

U.S. PATENT DOCUMENTS

| | | | | |
|---|---|---|---|---|
| 4,512,855 A | * | 4/1985 | Mazur | 205/50 |
| 4,963,512 A | * | 10/1990 | Iwanaga et al. | 216/18 |
| 5,953,629 A | * | 9/1999 | Imazeki et al. | 438/679 |
| 6,099,897 A | | 8/2000 | Sayo et al. | 427/180 |
| 6,305,627 B1 | | 10/2001 | Stiner et al. | 242/283 |
| 6,651,871 B2 | * | 11/2003 | Ogure | 228/248.1 |
| 6,841,192 B2 | * | 1/2005 | Hashimoto et al. | 427/100 |
| 6,877,853 B2 | * | 4/2005 | Kiguchi et al. | 347/102 |
| 6,972,256 B2 | * | 12/2005 | Fukunaga et al. | 438/679 |
| 6,991,949 B2 | * | 1/2006 | Muroyama et al. | 438/20 |
| 7,037,833 B2 | * | 5/2006 | Hasei | 438/674 |
| 7,053,126 B2 | * | 5/2006 | Yukinobu et al. | 516/97 |
| 7,071,084 B2 | * | 7/2006 | Yokoyama et al. | 438/584 |
| 7,081,214 B2 | * | 7/2006 | Matsuba et al. | 252/512 |
| 7,179,503 B2 | * | 2/2007 | Fukunaga et al. | 427/205 |
| 2002/0160103 A1 | * | 10/2002 | Fukunaga et al. | 427/125 |
| 2003/0157272 A1 | * | 8/2003 | Tonai et al. | 427/600 |
| 2004/0265549 A1 | * | 12/2004 | Kydd | 428/201 |
| 2006/0272948 A1 | * | 12/2006 | Yamamoto et al. | 205/52 |
| 2006/0284829 A1 | * | 12/2006 | Moriyama et al. | 345/107 |
| 2007/0141251 A1 | * | 6/2007 | Fukunaga et al. | 427/226 |

FOREIGN PATENT DOCUMENTS

TW   414951   12/2000

* cited by examiner

*Primary Examiner*—M. Wilczewski
(74) *Attorney, Agent, or Firm*—WPAT. P.C.; Justin King

(57) ABSTRACT

An electrode and a method for forming the electrode. The electrode comprises: a substrate; and a plurality of metal particles adhering to the substrate. The method comprises steps of: providing a substrate; providing a solution including a solvent and a plurality of metal particles on the substrate; removing the solvent; and making the plurality of metal particles adhere to the substrate.

8 Claims, 5 Drawing Sheets

ELECTRODE AND METHOD FOR FORMING THE SAME

BACKGROUND OF THE INVENTION

1. Field of the Invention

The present invention generally relates to an electrode and a method for forming the same and, more particularly, to an electrode with a plurality of metal particles and a method for forming the electrode.

2. Description of the Prior Art

Electrodes are conventionally manufactured by electroplating or evaporation on rigid substrates using expensive equipments at high temperatures. However, it is not easy for such electrodes to be connected to other materials such as metal wires for module integration.

A conventional method for forming an electrode is Taiwan Patent Pub. No. 414,951 filed by TSMC, disclosing a method for forming electrodes used in capacitors having dielectric with a high dielectric constant. The method is as described in FIG. 1 to FIG. 6, comprising steps of: providing a substrate 11 (as shown in FIG. 1); forming an electrode defining layer 12 on the substrate 11 (as shown in FIG. 2); forming an opening 14 in the electrode defining layer 12 using photo-lithography with a photo-resist layer 16 (as shown in FIG. 3); filling the opening 14 with a conductive material 18 covering the electrode defining layer 12 (as shown in FIG. 4); removing the conductive material 18 outside the opening 14 (as shown in FIG. 5); and removing the electrode defining layer 12 (as shown in FIG. 6).

Accordingly, the conductive material is formed by conventional chemical vapor-phase deposition (CVD), physical vapor-phase deposition (PVD) or sputtering so that it has difficulty being connected to other materials such as metal wires for module integration. Meanwhile, the conductive material thus formed cannot be deposited on a flexible substrate due to a mismatched interface between the conductive material (mostly, metal) and polymer. Moreover, the aforementioned process is relatively complicated and costly.

Therefore, to overcome the aforementioned shortcomings, there is need in providing an electrode and a method for forming the electrode so as to reduce the cost, simplify the process, and make it feasible to form on a flexible substrate at a low temperature the electrode able to be connected to other materials such as metal wires.

SUMMARY OF THE INVENTION

It is a primary object of the present invention to provide an electrode and a method for forming the electrode so as to reduce the cost, simplify the process, and make it feasible to form on a flexible substrate at a low temperature the electrode able to be connected to other materials such as metal wires.

In order to achieve the foregoing object, the present invention provides a method for forming an electrode, the method comprising steps of: providing a substrate; providing a solution including a solvent and a plurality of metal particles on the substrate; removing the solvent; and making the plurality of metal particles adhere to the substrate.

Preferably, the plurality of metal particles are bonded with the substrate by chemical bonding.

Preferably, the substrate is formed of a recrystallizable material.

Preferably, the recrystallizable material is a conductive polymer material.

Preferably, the substrate is a flexible substrate.

Preferably, the solvent comprises methyl benzene, phenol or aldehyde.

Preferably, the plurality of metal particles comprise nickel (Ni), tin (Sn), silver (Ag) or gold (Au).

Preferably, the solution is provided on the substrate by spin coating, ink-jet printing, screen printing or imprinting.

Preferably, the method further comprises a step of: electrically coupling the substrate to a circuit device.

Preferably, the method further comprises a step of: providing a thermal sensitive polymer material on the substrate.

The present invention further provides an electrode, comprising: a substrate; and a plurality of metal particles adhering to the substrate.

Preferably, the plurality of metal particles are bonded with the substrate by chemical bonding.

Preferably, the substrate is formed of a recrystallizable material.

Preferably, the recrystallizable material is a conductive polymer material.

Preferably, the substrate is a flexible substrate.

Preferably, the plurality of metal particles comprise nickel (Ni), tin (Sn), silver (Ag) or gold (Au).

Preferably, the plurality of metal particles adhere to the substrate by means of providing a solution comprising a solvent and the plurality of metal particles on the substrate.

Preferably, the solvent comprises methyl benzene, phenol or aldehyde.

Preferably, the solution is provided on the substrate by spin coating, ink-jet printing, screen printing or imprinting.

Preferably, the electrode further comprises: a thermal sensitive polymer material on the substrate.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE PREFERRED EMBODIMENT

The present invention providing an electrode and a method for forming the electrode can be exemplified by the preferred embodiments as described hereinafter.

Figure 1:
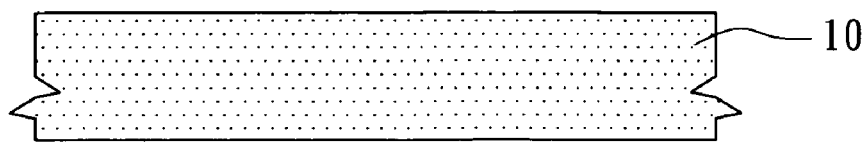
FIG. 1 to FIG. 6 are schematic diagrams showing a conventional method for forming an electrode in the prior art.
Figure 2:
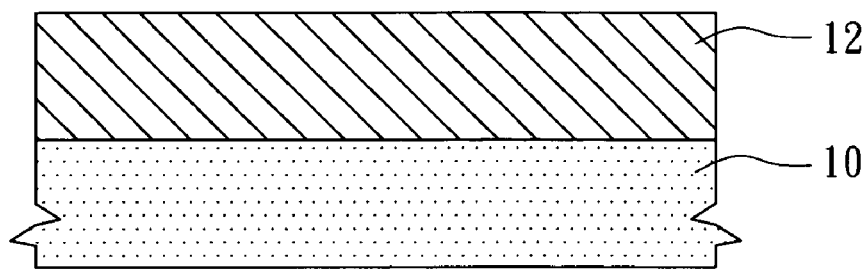
Figure 3:
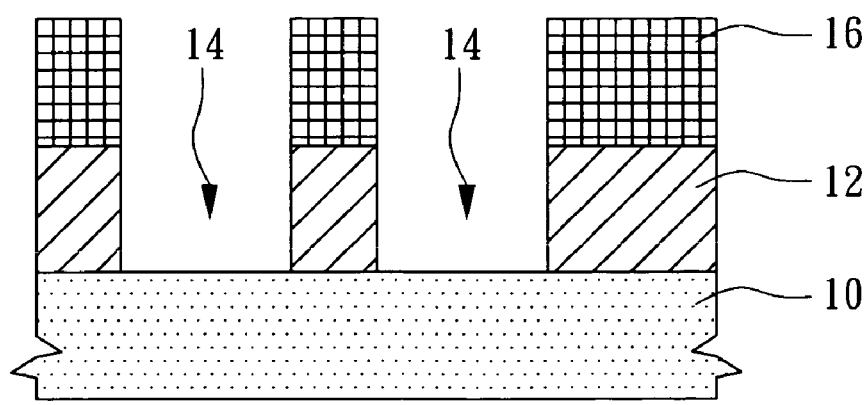
Figure 4:
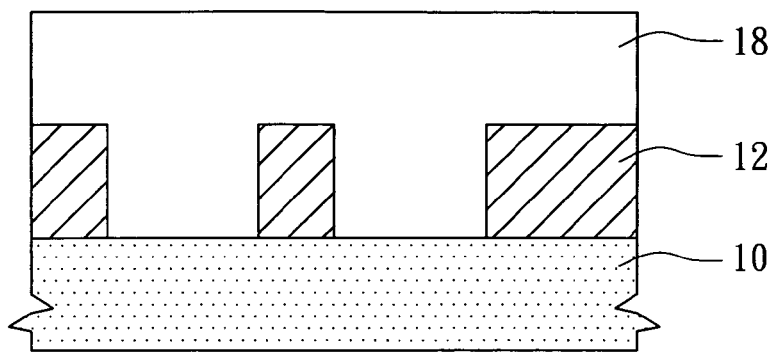
Figure 5:
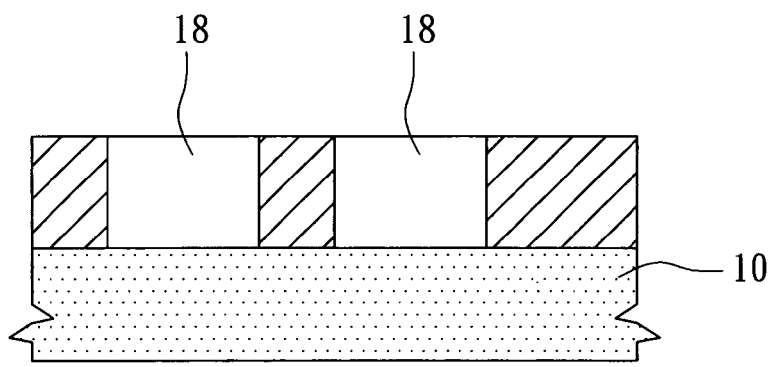
Figure 6:
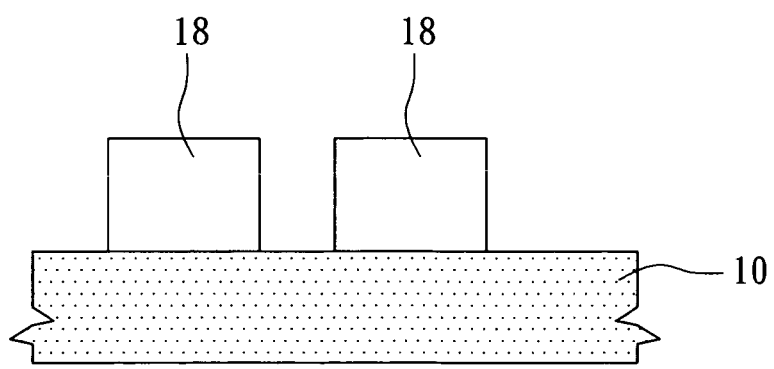
Figure 7:
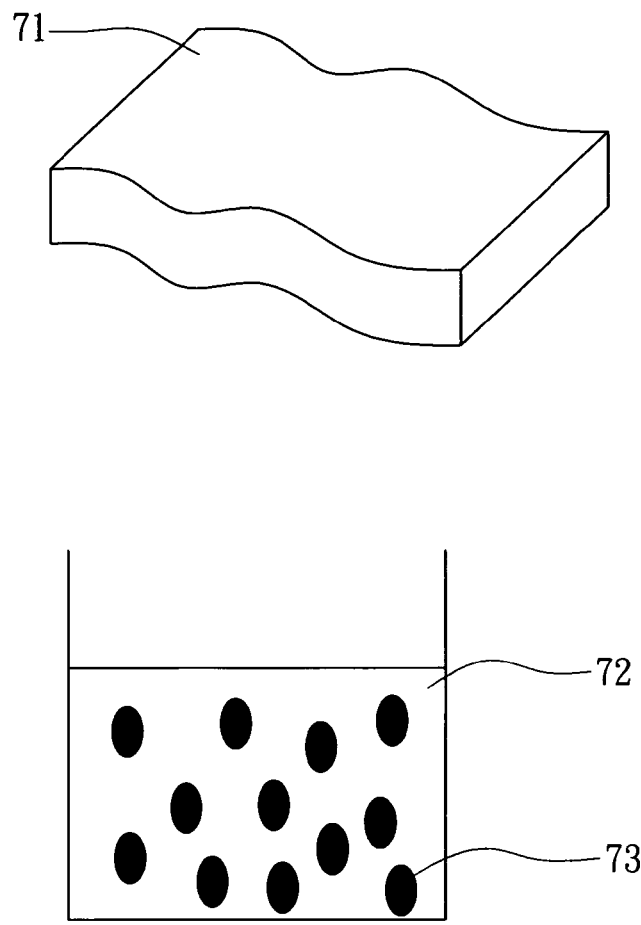
FIG. 7 is a schematic diagram showing a substrate and a solution.

Please refer to FIG. 7, which is a schematic diagram showing a substrate and a solution. In one embodiment, the substrate 71 is a flexible substrate. Preferably, the substrate 71 is formed of a recrystallizable material such as a conductive polymer material. The solution comprises a solvent 72 and a plurality of metal particles 73. Preferably, the solvent 72 is an organic solvent comprising methyl benzene, phenol or aldehyde. The plurality of metal particles 73 comprise nickel (Ni), tin (Sn), silver (Ag) or gold (Au).

Figure 8:
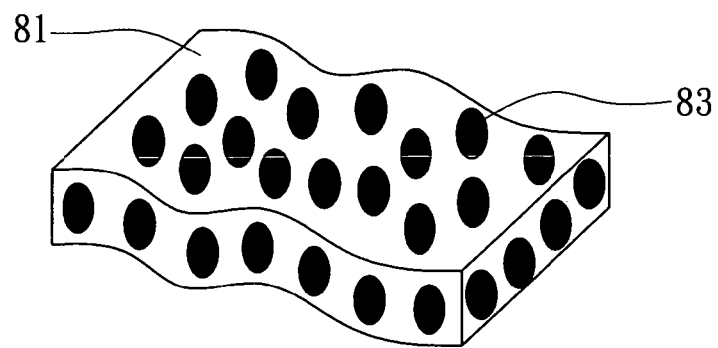
FIG. 8 is a schematic diagram showing an electrode according to the present invention.

FIG. 8 is a schematic diagram showing an electrode according to the present invention. As the solvent 72 is provided on the substrate 71 by spin coating, ink-jet printing, screen printing or imprinting, the coated region (not shown) on the substrate 71 is dissolved to recrystallize. Accordingly, the plurality of metal particles 73 adhere to the substrate 71 by means of being introduced into the recrystallized region. A conductive region is thus formed as an electrode on the substrate 71. Alternatively, the conductive region can be defined on the substrate 71 using photo-lithography. Afterwards, the substrate 71 can be electrically coupled to a circuit device (not shown). Furthermore, a thermal sensitive polymer material (not shown) can also be provided on the substrate 71 so that the substrate 71 provides heat conductivity and thermal conductivity.

Figure 9:
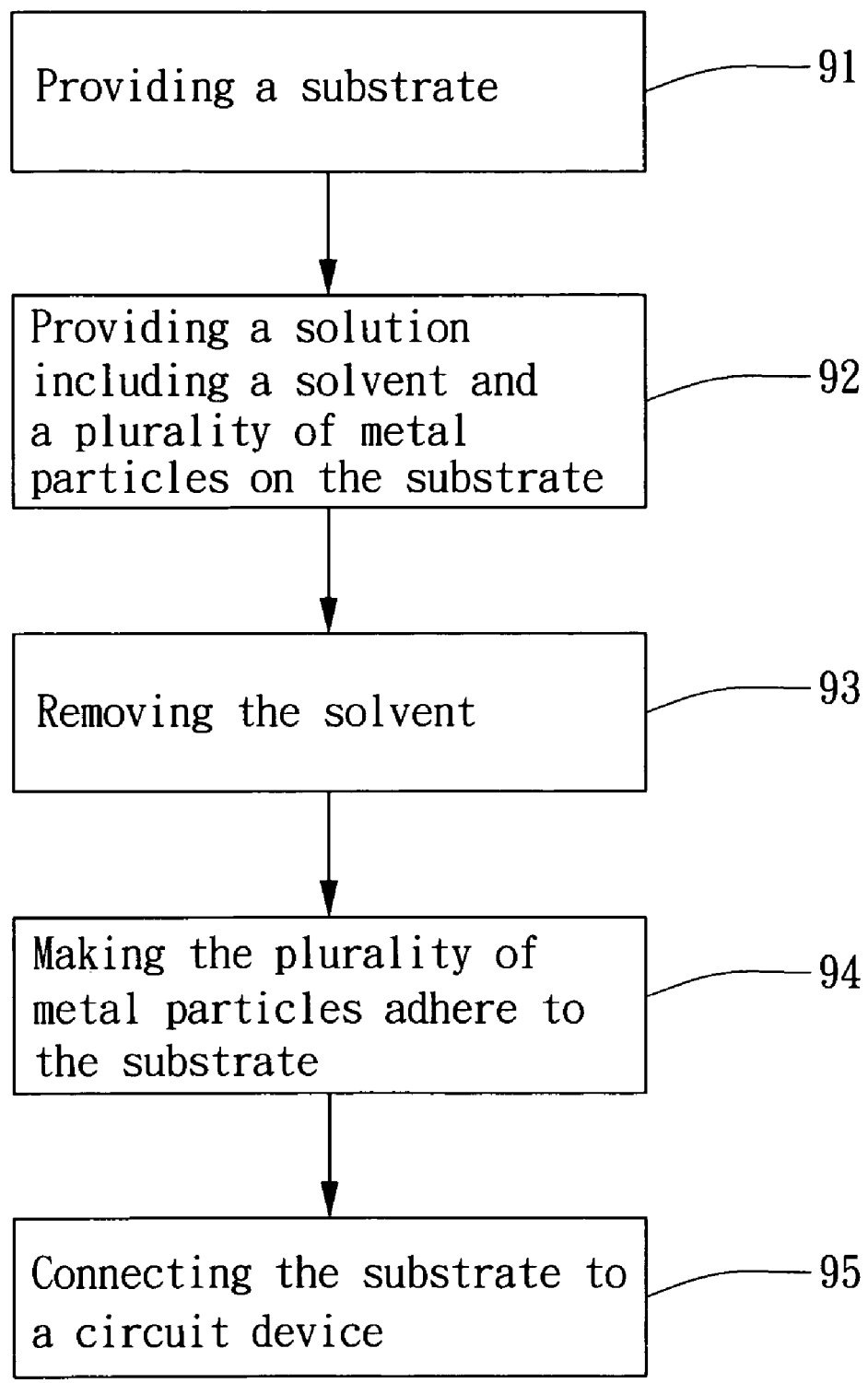
FIG. 9 is a flow chart showing a method for forming an electrode according to a first embodiment of the present invention.

FIG. 9 is a flow chart showing a method for forming an electrode according to a first embodiment of the present invention. In Step 91, a substrate is provided. In the present embodiment, the substrate is a flexible substrate. Preferably, the substrate is formed of a recrystallizable material such as a conductive polymer material.

In Step 92, a solution comprising a solvent and a plurality of metal particles is provided on the substrate. In the present embodiment, the solvent comprises methyl benzene, phenol or aldehyde. Preferably, the plurality of metal particles comprise nickel (Ni), tin (Sn), silver (Ag) or gold (Au).

Then, the solvent is heated or air-dried to be removed from the substrate, as described in Step 93.

In Step 94, the metal particles adhere to the substrate.

More particularly, since the substrate is dissolvable using a solvent, the metal particles in the dissolved region of the substrate can be introduced into the substrate during recrystallization. Consequently, the metal particles are bonded with the substrate by chemical bonding.

The electrode of the present invention is thus formed. The method of the present invention further comprises a Step 95 of electrically coupling the substrate to a circuit device so that the substrate is used as an electrode.

Figure 10:
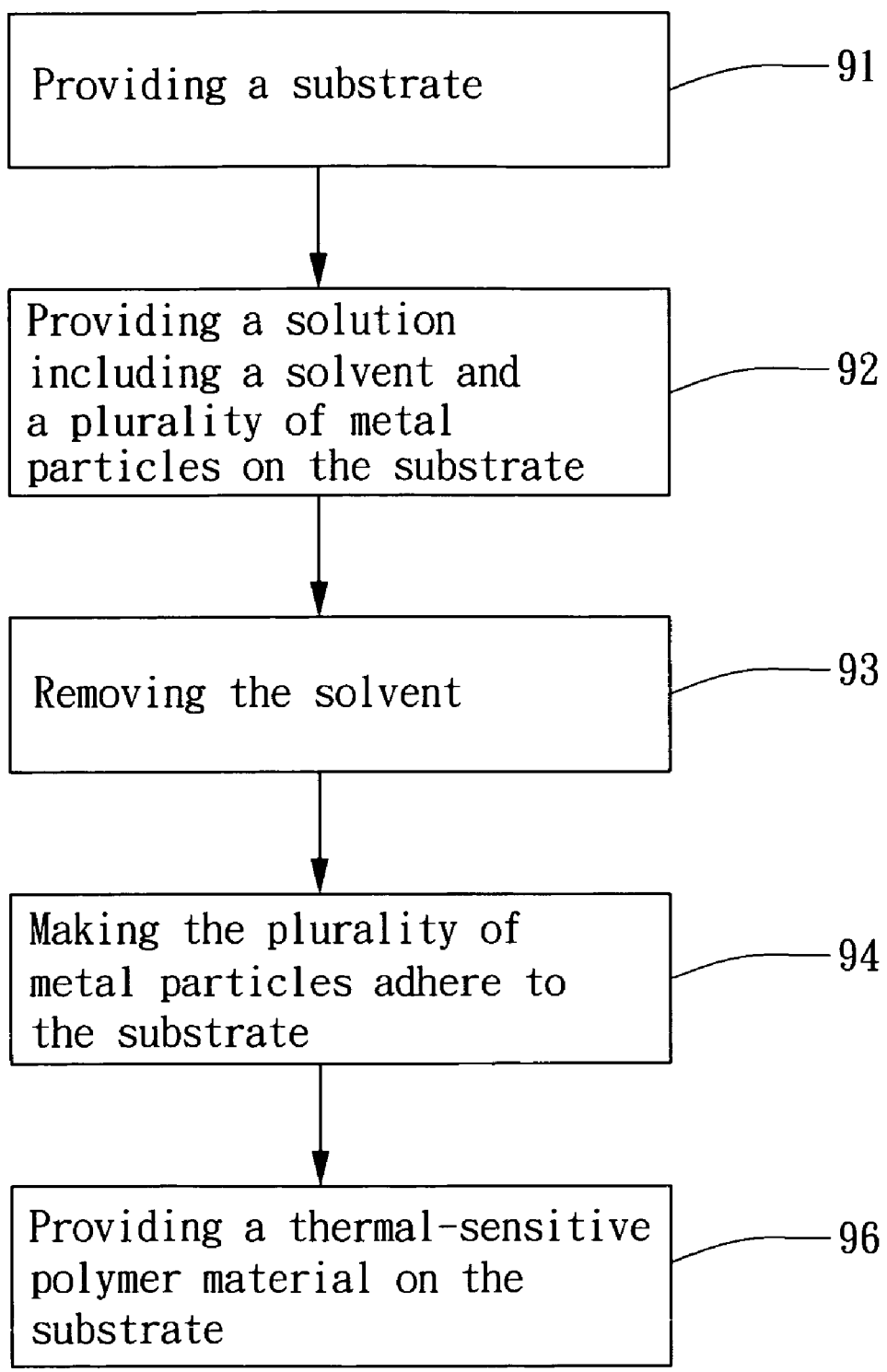
FIG. 10 is a flow chart showing a method for forming an electrode according to a second embodiment of the present invention.

Furthermore, FIG. 10 is a flow chart showing a method for forming an electrode according to a second embodiment of the present invention. Similarly, In Step 91, a substrate is provided. In the present embodiment, the substrate is a flexible substrate. Preferably, the substrate is formed of a recrystallizable material such as a conductive polymer material.

In Step 92, a solution comprising a solvent and a plurality of metal particles is provided on the substrate. In the present embodiment, the solvent comprises methyl benzene, phenol or aldehyde. Preferably, the plurality of metal particles comprise nickel (Ni), tin (Sn), silver (Ag) or gold (Au).

Then, the solvent is heated or air-dried to be removed from the substrate, as described in Step 93.

In Step 94, the metal particles adhere to the substrate.

More particularly, since the substrate is dissolvable using a solvent, the metal particles in the dissolved region of the substrate can be introduced into the substrate during recrystallization. Consequently, the metal particles are bonded with the substrate by chemical bonding.

The electrode of the present invention is thus formed. The method of the present invention further comprises a Step 96 of providing a thermal sensitive polymer material on the substrate so that the substrate is used as a sensor device. In other words, the substrate can provide various characteristics such as electric conductivity, thermal conductivity, light conductivity, magnetism permeability, or EMI immunity using different polymer materials.

Compared to the method of the present invention, the conventional method requires electrode pattern defining, photo-lithography, metallization using CVD, PVD or sputtering, and chemical-mechanical polishing (CMP).

Therefore, the method of the present invention has advantages in:

(1) wide applications for both rigid substrates and flexible substrate;

(2) lower temperature and lower cost without conventional CVD, PVD or sputtering;

(3) feasibility to form on a flexible substrate an electrode able to be connected to other materials such as metal wires and devices.

According to the above discussion, it is apparent that the present invention discloses an electrode and a method for forming the electrode so as to reduce the cost, simplify the process, and make it feasible to form on a flexible substrate at a low temperature the electrode able to be connected to other materials such as metal wires. Therefore, the present invention is novel, useful and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for forming an electrode, said method comprising steps of:
   providing a substrate;
   providing a solution including a solvent and a plurality of metal particles on said substrate;
   removing said solvent; and
   making said plurality of metal particles adhere to said substrate,
   wherein said substrate is formed of a recrystallizable material,
   wherein said recrystallizable material is a conductive polymer material.

2. The method as recited in claim 1, wherein said plurality of metal particles are bonded with said substrate by chemical bonding.

3. The method as recited in claim 1, wherein said substrate is a flexible substrate.

4. The method as recited in claim 1, wherein said solvent comprises a material selected from a group including methyl benzene, phenol, aldehyde and combination thereof.

5. The method as recited in claim 1, wherein said plurality of metal particles comprise a material selected from a group including nickel (Ni), tin (Sn), silver (Ag), gold (Au) and combination thereof.

6. The method as recited in claim 1, wherein said solution is provided on said substrate by a process selected from a group including spin coating, ink-jet printing, screen printing and imprinting.

7. The method as recited in claim 1, further comprising a step of:
   electrically coupling said substrate to a circuit device.

8. The method as recited in claim 1, further comprising a step of:
   providing a thermal sensitive polymer material on said substrate.

* * * * *